(12) United States Patent
Ponoth et al.

(10) Patent No.: US 9,209,202 B2
(45) Date of Patent: Dec. 8, 2015

(54) ENABLING BULK FINFET-BASED DEVICES FOR FINFET TECHNOLOGY WITH DIELECTRIC ISOLATION

(71) Applicant: BROADCOM CORPORATION, Irvine, CA (US)

(72) Inventors: Shom Surendran Ponoth, Los Angeles, CA (US); Changyok Park, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/192,798

(22) Filed: Feb. 27, 2014

(65) Prior Publication Data

US 2015/0228668 A1    Aug. 13, 2015

Related U.S. Application Data

(60) Provisional application No. 61/938,648, filed on Feb. 11, 2014.

(51) Int. Cl.
*H01L 21/84* (2006.01)
*H01L 27/12* (2006.01)
*H01L 21/762* (2006.01)

(52) U.S. Cl.
CPC ...... *H01L 27/1207* (2013.01); *H01L 21/76224* (2013.01); *H01L 21/845* (2013.01); *H01L 27/1211* (2013.01)

(58) Field of Classification Search
CPC .................................................. H01L 27/1207
USPC ......................................................... 438/157
See application file for complete search history.

(56) References Cited

U.S. PATENT DOCUMENTS

| 7,833,867 | B2* | 11/2010 | Fujimoto | 438/294 |
|---|---|---|---|---|
| 8,039,843 | B2* | 10/2011 | Inaba | 257/64 |
| 2007/0267695 | A1 | 11/2007 | Lee | |
| 2009/0278196 | A1 | 11/2009 | Chang et al. | |
| 2010/0163971 | A1 | 7/2010 | Hung et al. | |
| 2013/0020640 | A1 | 1/2013 | Chen et al. | |
| 2013/0181263 | A1 | 7/2013 | Cai et al. | |
| 2015/0097220 | A1* | 4/2015 | Ponoth et al. | 257/296 |

FOREIGN PATENT DOCUMENTS

| JP | H 06-342911 A | 12/1994 |
|---|---|---|
| WO | WO-2013/095384 A1 | 6/2013 |

* cited by examiner

*Primary Examiner* — Anthony Ho
(74) *Attorney, Agent, or Firm* — McDermott Will & Emery LLP

(57) ABSTRACT

A method for forming a dielectric-isolated bulk fin field-effect transistor (finFET) device includes forming a second isolation layer over a first structure including multiple partially exposed fins and horizontal areas including a first isolation layer. The second isolation layer is removed from horizontal areas of a first portion of the first structure. An oxide layer is formed under the fins of the first portion of the first structure. The second isolation layer is removed in order to expose the partially exposed fins and horizontal areas of the first structure to form a second structure, on which gate regions are formed.

12 Claims, 7 Drawing Sheets

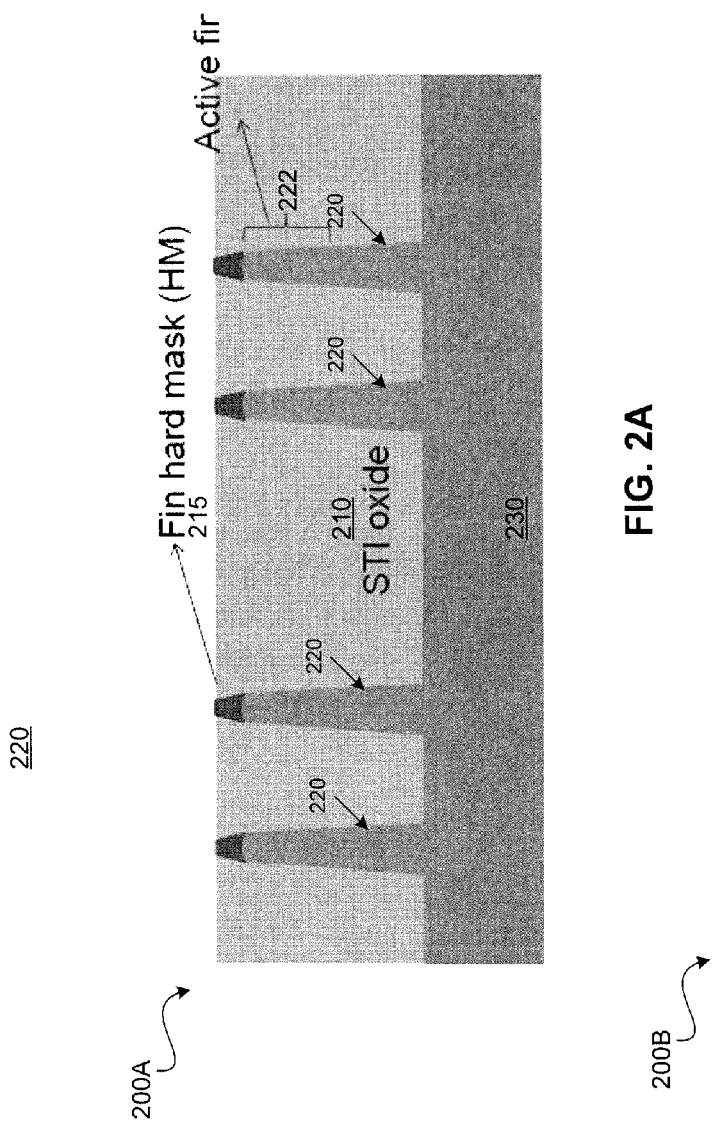
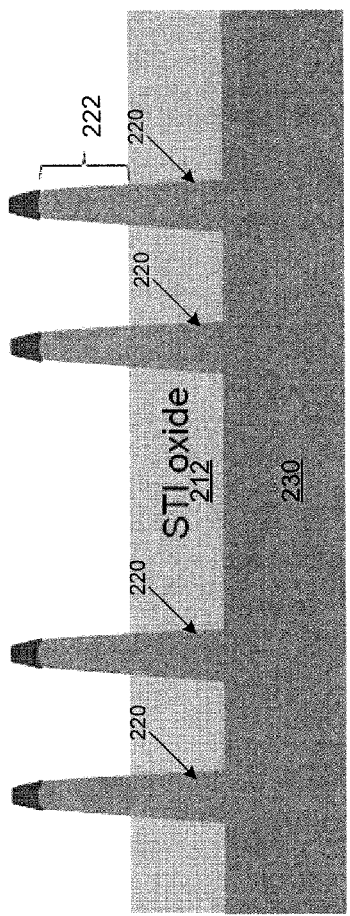
FIG. 2A
FIG. 2B

ENABLING BULK FINFET-BASED DEVICES FOR FINFET TECHNOLOGY WITH DIELECTRIC ISOLATION

CROSS-REFERENCE TO RELATED APPLICATIONS

This application claims the benefit of priority under 35 U.S.C. §119 from U.S. Provisional Patent Application 61/938,648 filed Feb. 11, 2014, which is incorporated herein by reference in its entirety.

TECHNICAL FIELD

The present description relates generally to integrated circuits, and more particularly, but not exclusively, to enabling bulk fin field-effect transistor (finFET)-based devices for finFET technology with dielectric isolation.

BACKGROUND

There are a number of challenges that scaling of conventional planar metal-oxide-semiconductor field-effect transistors (MOSFETs) are faced with. For example, threshold swing degradation, large drain-induced barrier lowering (DIBL), device characteristics fluctuations, and leakage are among the most common problems that may be addressed by 3-D device structures. FinFETs are 3-D device structures that can be used in nano-scale complementary metal-oxide-semiconductor (CMOS) and high-density memory applications.

FinFET devices are divided into two categories, bulk finFETs and silicon-on-insulator (SOI) finFETs. In bulk finFET devices, which are more common in 14 nm and/or 16 nm technology, the fin can be formed on the bulk silicon (e.g., silicon substrate). In SOI finFET the fin is isolated from the bulk silicon by a silicon oxide (e.g., SiO2) layer. The bulk finFET can be produced at low cost, low defect density, high heat transfer to substrate, and good process control. In some bulk finFETs, in order to prevent punch-through leakage from fin to the substrate, punch-through stop implants (e.g., n-type or p-type) can be used for junction isolation. However, punch-through stop implants may not be able to solve the leakage issue completely. Therefore, in future bulk finFET devices, dielectric isolation may be the preferred choice to address the leakage problem.

BRIEF DESCRIPTION OF THE DRAWINGS

Certain features of the subject technology are set forth in the appended claims. However, for purpose of explanation, several embodiments of the subject technology are set forth in the following figures.

FIGS. 2A through 2G illustrate examples of in-process structures of a process of formation of the finFET devices of FIG. 1 in accordance with one or more implementations.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides methods and implementations for enabling bulk finFET-based devices for finFET technology with dielectric isolation. In one or more implementations, the subject technology allows for concurrent formation of bulk finFET devices and dielectric-isolated finFET devices on the same substrate. Bulk finFET is suitable for a number of devices such as vertical bipolar-junction transistors (BJTs), laterally-diffused MOS (LDMOS) devices, electrostatic discharge (ESD) diodes, and varactor devices. The disclosed solution facilitates integration of these devices with digital circuitries (e.g., memory and logic circuits) realized with dielectric-isolated finFET devices on the same chip using finFET-based CMOS technology.

Figure 1:
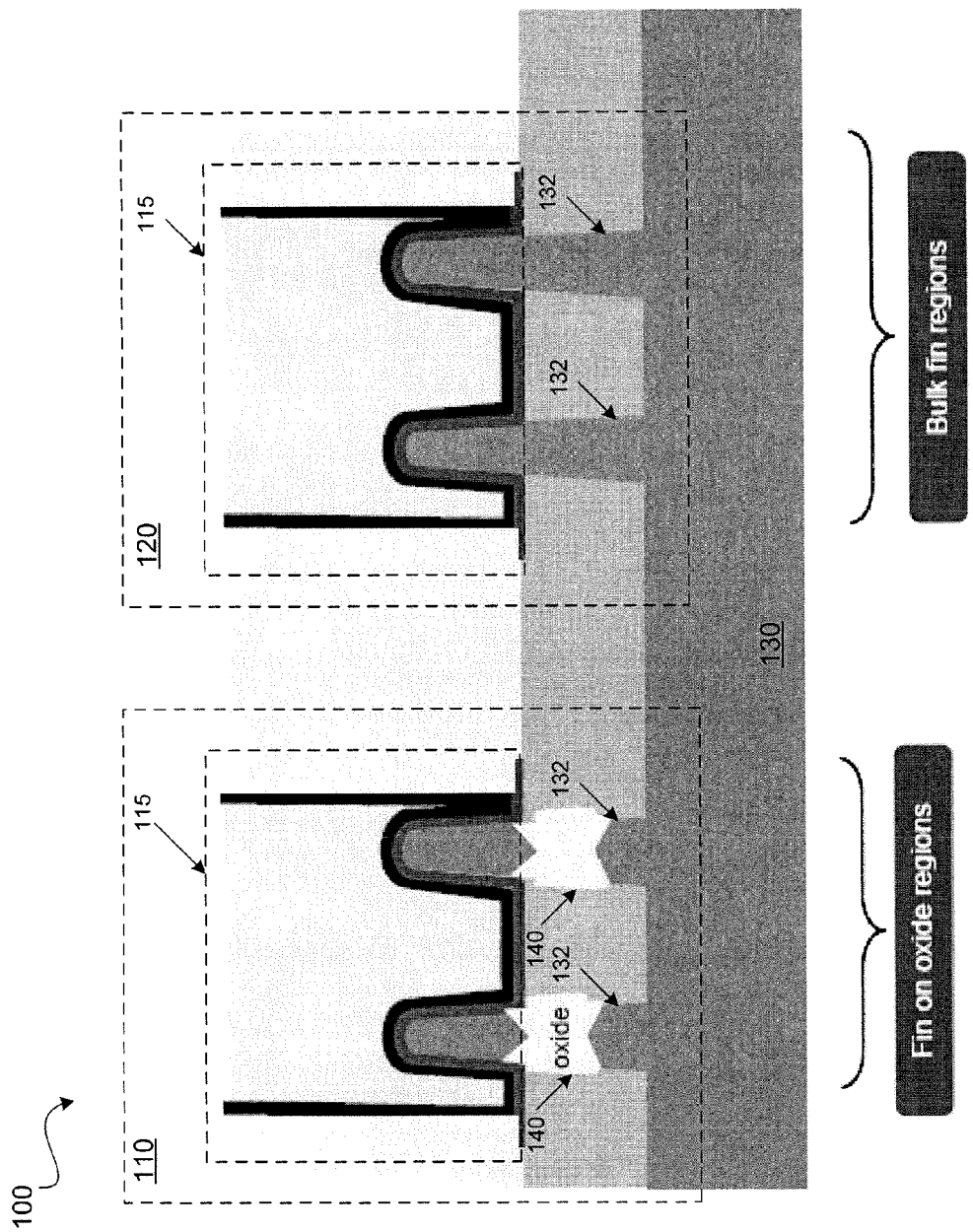
FIG. 1 illustrates examples of fin field-effect transistor (finFET) structures in accordance with one or more implementations.

FIG. 1 illustrates examples of fin field-effect transistor (finFET) structures 100 in accordance with one or more implementations of the subject technology. The example finFET structures 100 includes a number of dielectric-isolated bulk finFET devices 110 and bulk finFET devices 120, each including a fin 132 that is formed over a substrate 130. In FIG. 1, only two devices are depicted and the corresponding source and drain portions of the devices are not shown, for simplicity. Each dielectric-isolated bulk finFET device includes a fin 132 that is isolated from a substrate 130 by an oxide layer 140. The dielectric-isolated bulk finFET devices 110 and the bulk finFET devices 120 include gate regions 115, as described herein. The dielectric-isolated bulk finFET devices 110 and the bulk finFET devices 120 may be realized on fin-on-oxide regions and bulk fin regions of the substrate 130.

One or more implementations of the finFET circuit 100 allow integration of high-performance analog and digital circuitries that can be implemented in finFET-based CMOS technology. Such high-speed analog and digital circuitries can be used in a number of systems and devices including communication devices (e.g., cellphones and tablets), laptops and personal computers, and other electronic systems and devices. The subject disclosure provides a method for concurrent implementation of the dielectric-isolated bulk finFET devices 110 and the bulk finFET devices 120 on the same substrate (e.g., 130). The disclosed method is described herein with respect to FIGS. 2A through 2G.

FIGS. 2A through 2G illustrate examples of in-process structures 200A through 200G of a process of formation of the finFET devices of FIG. 1 in accordance with one or more implementations of the subject technology. In one or more implementations, a method for concurrent formation of a dielectric-isolated bulk finFET device (e.g., 110 of FIG. 1) and a bulk finFET device (e.g., 120 of FIG. 1) can start with the in-process structure (hereinafter "structure") 200A of FIG. 2A that includes a number of fins 220 formed over a substrate 230 and an isolation layer 210, such as a shallow-trench isolation (STI) layer 210. A tip of each fin 220 is covered with a hard mask 215. In a next step, a portion (e.g., a certain thickness) of the STI oxide 210 is removed to expose a portion of the height of each fin (e.g., an active fin region 222).

FIG. 2B shows a structure 200B (e.g., a first structure) that is formed by removing the portion of the STI oxide 210 that surrounds the active regions 222 of the fins 220 and leaving behind a first isolation layer 212. In other words, the first structure 200B includes multiple fins 220 formed on the substrate 230 (e.g., silicon). The fins 220 are partially exposed above the first isolation layer 212.

Figure 2C:
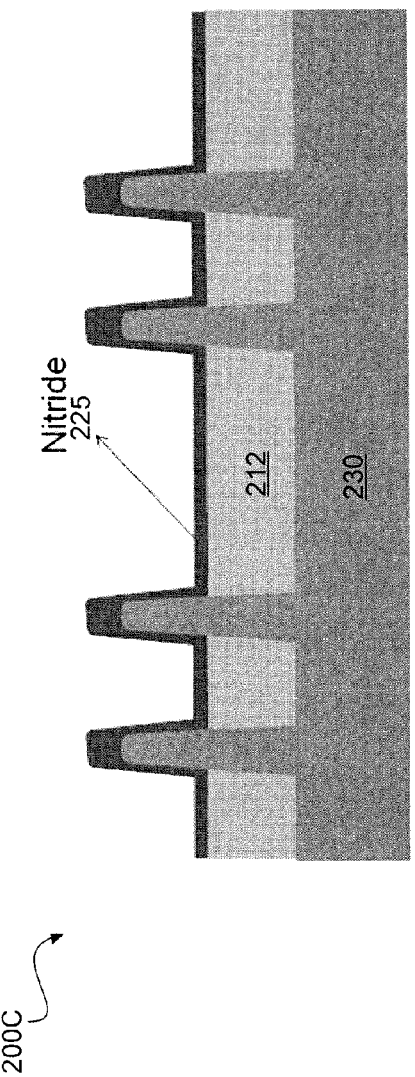
Figure 2D:
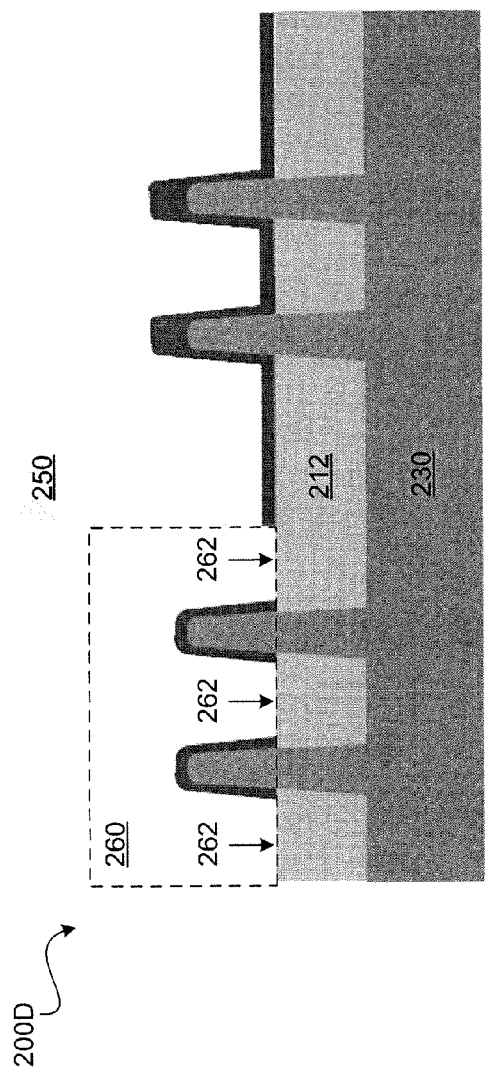

The next step in the process is the formation of a second isolation layer 225 over the first structure (e.g., 200B of FIG. 2B), which results in the structure 200C of FIG. 2C. The second isolation layer 225 may be a nitride layer (e.g., silicon nitride) that can be formed by depositing silicon nitride layer, for example, by atomic-layer deposition (ALD) or molecular-layer deposition (MLD). The second isolation layer 225 is then removed from horizontal areas of a first portion 260 of the first structure to create openings 262 in the second isolation layer 225. This step is performed by using a spacer-etch process after covering the remaining areas of the first structure with a mask 250, as shown in the resulting structure 200D of FIG. 2D.

Figure 2E:
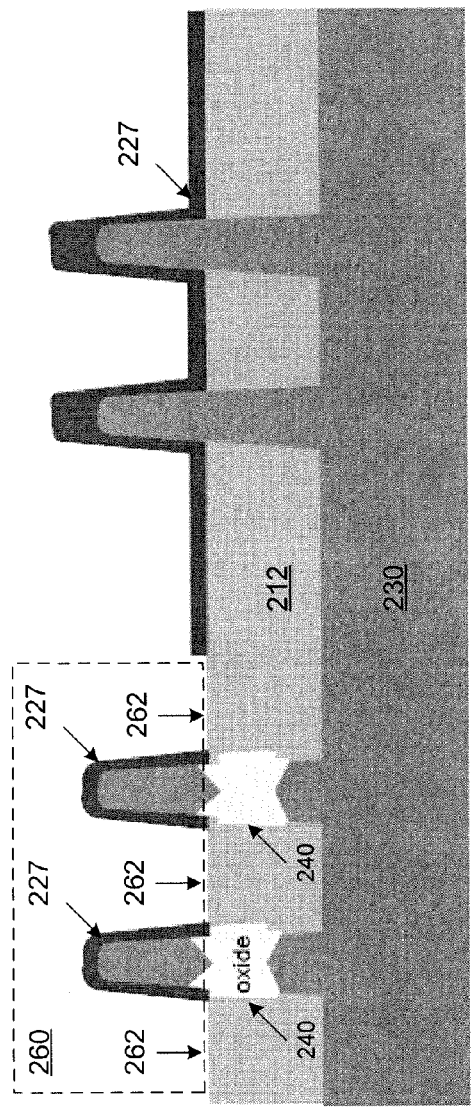

The openings 262 in the second isolation layer (e.g., 225 of FIG. 2C) allow for the oxidation process, which is the subsequent step in the process as shown in FIG. 2E. The structure 200E of FIG. 2E shows the oxide layers 240 under the fins of the first portion 260 of the structure 200E. For the oxidation process used to form the oxide layers 240, the first isolation layer 212 is not a barrier, as the reaming portion 227 of the second isolation layer is.

Figure 2F:
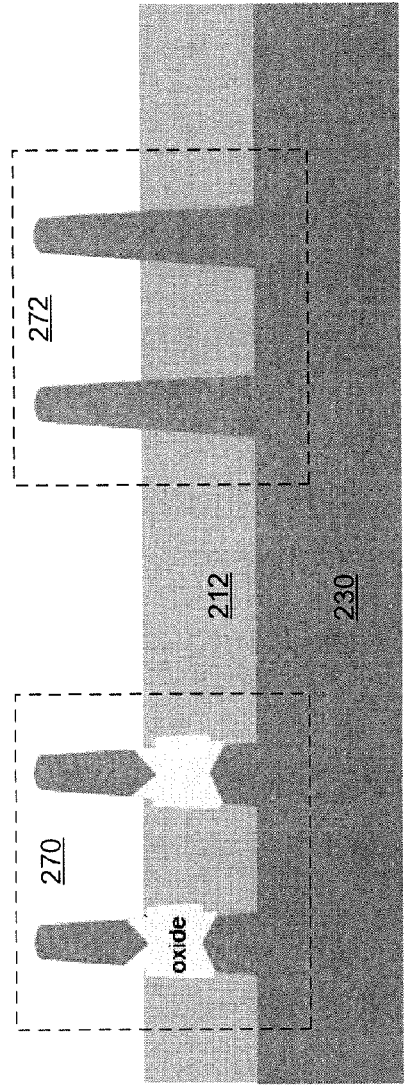

The structure 200F of FIG. 2F results from removing the reaming portion 227 of the second isolation layer and the fin hard masks from the structure 200E of FIG. 2E. The structure 200F (e.g., the second structure) includes a fin-on-oxide region 270 and a bulk fin region 272.

Figure 2G:
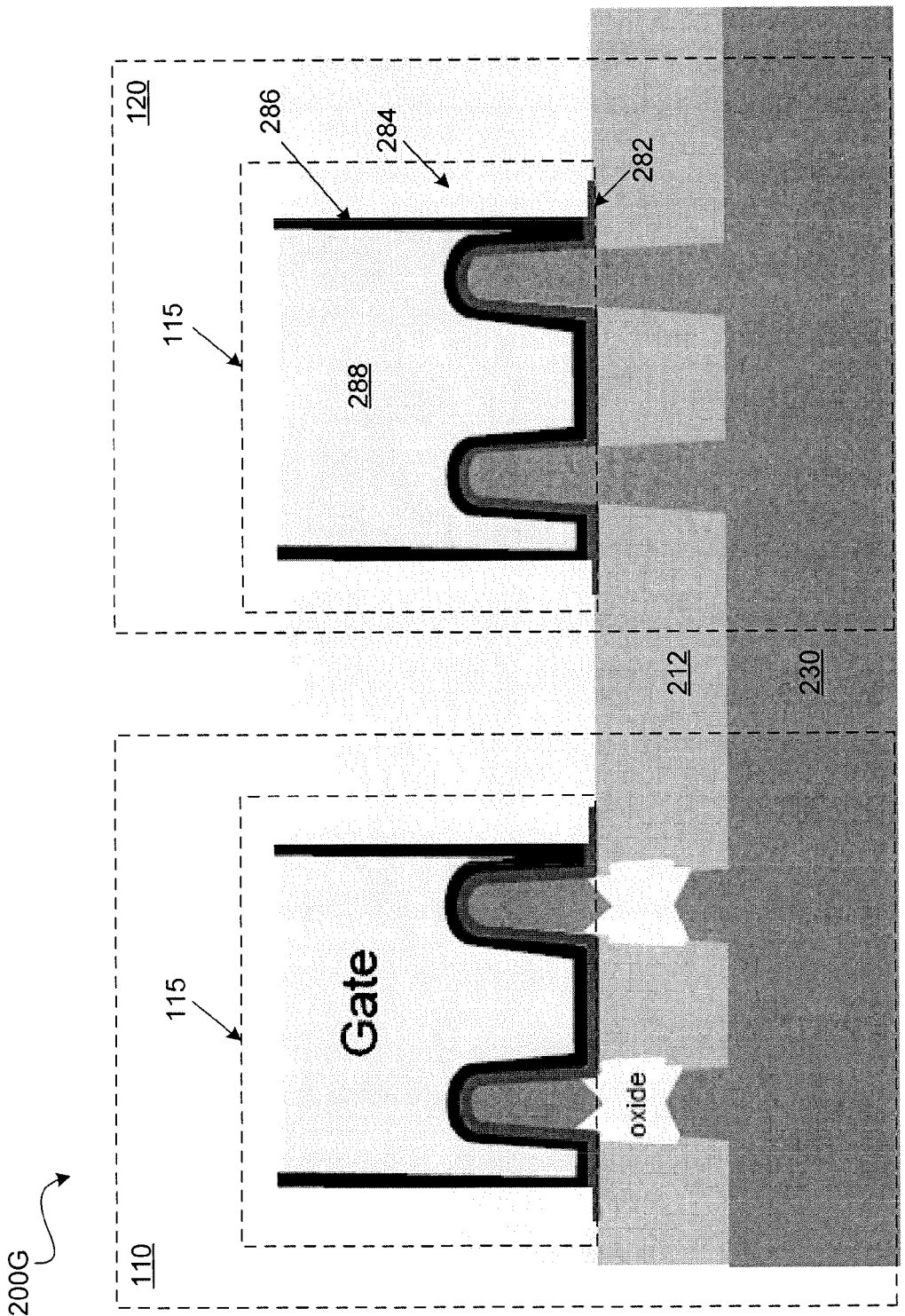

The final step in the process of concurrent formation of the dielectric-isolated bulk finFET devices 110 and the bulk finFET devices 120 is to form gate regions 115, as shown in the final structure 200G of FIG. 2G. The gate regions 115 are formed over the second structure 200F of FIG. 2F. The gate regions 115 include a gate oxide layer 282 (e.g., silicon oxide), a high-K dielectric layer 286, and a work-function metal and gate metal layer 288 and is formed over the active regions of the fins. The gate regions 115 are surrounded by the spacer layer 284.

Figure 3:
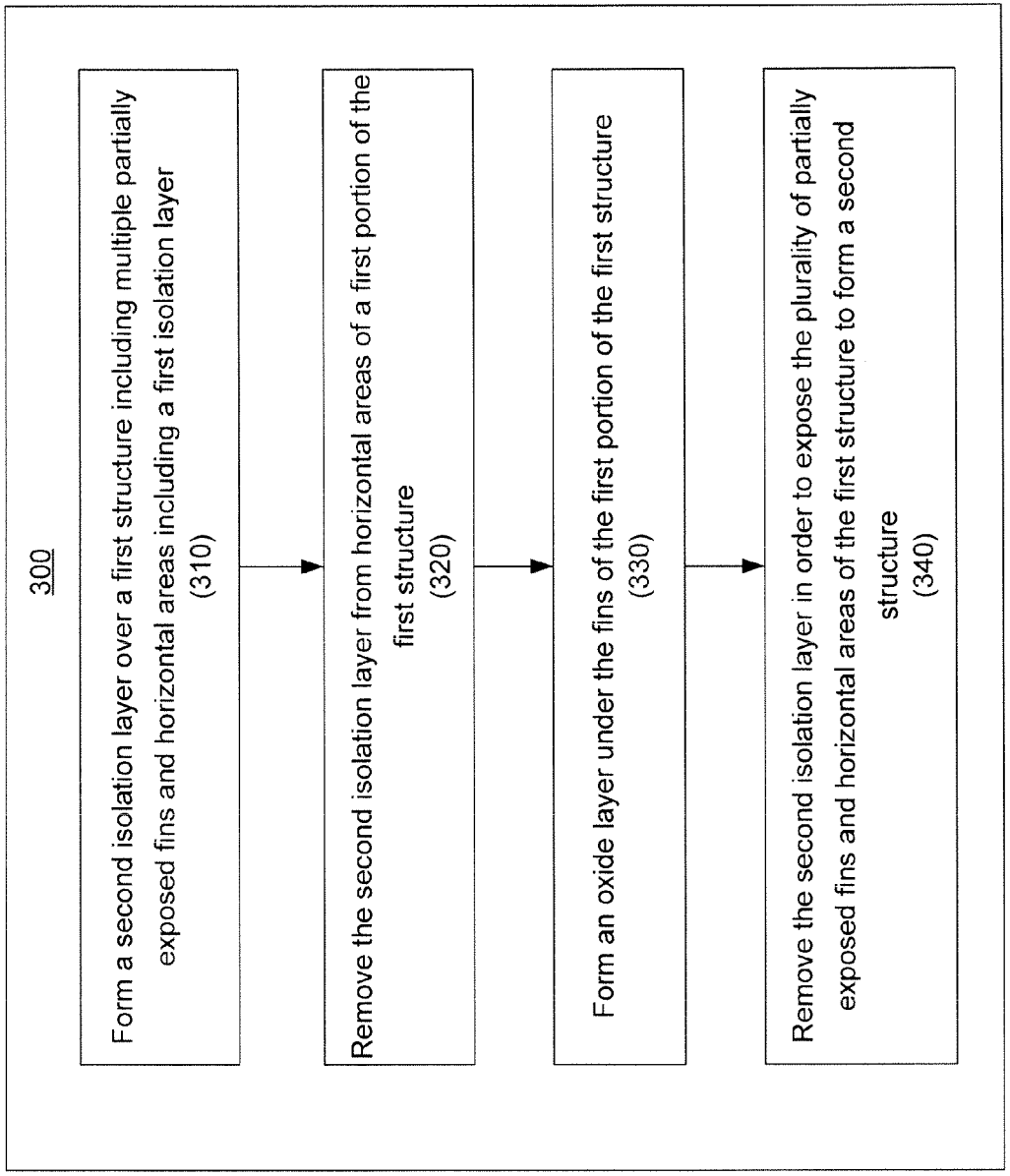
FIG. 3 illustrates an example of a method for forming a dielectric-isolated bulk finFET device in accordance with one or more implementations.

FIG. 3 illustrates an example of a method for forming a dielectric-isolated bulk finFET device (e.g., 110 of FIG. 1) in accordance with one or more implementations of the subject technology. For explanatory purposes, the example method 300 is described herein with reference to, but is not limited to, the process disclosed with respect the in-process structures of FIGS. 2A through 2G. Further, for explanatory purposes, the blocks of the example method 300 are described herein as occurring in serial, or linearly. However, multiple blocks of the example method 300 can occur in parallel. In addition, the blocks of the example method 300 need not be performed in the order shown and/or one or more of the blocks of the example method 300 need not be performed.

The method 300 includes forming a second isolation layer (e.g., 225 of FIG. 2C) over a first structure (e.g., 200B of FIG. 2B) including multiple partially exposed fins (e.g., 220 of FIG. 2B) and horizontal areas including a first isolation layer (e.g., 212 of FIG. 2B) (310). The second isolation layer (e.g., 225 of FIG. 2C) is removed from horizontal areas (e.g., 262 of FIG. 2D) of a first portion (e.g., 260 of FIG. 2D) of the first structure (320). An oxide layer (e.g., 240 of FIG. 2E) is formed under the fins of the first portion of the first structure (330). The second isolation layer is removed in order to expose the partially exposed fins and horizontal areas of the first structure to form a second structure (e.g., 200F of FIG. 2F) (340).

Figure 4:
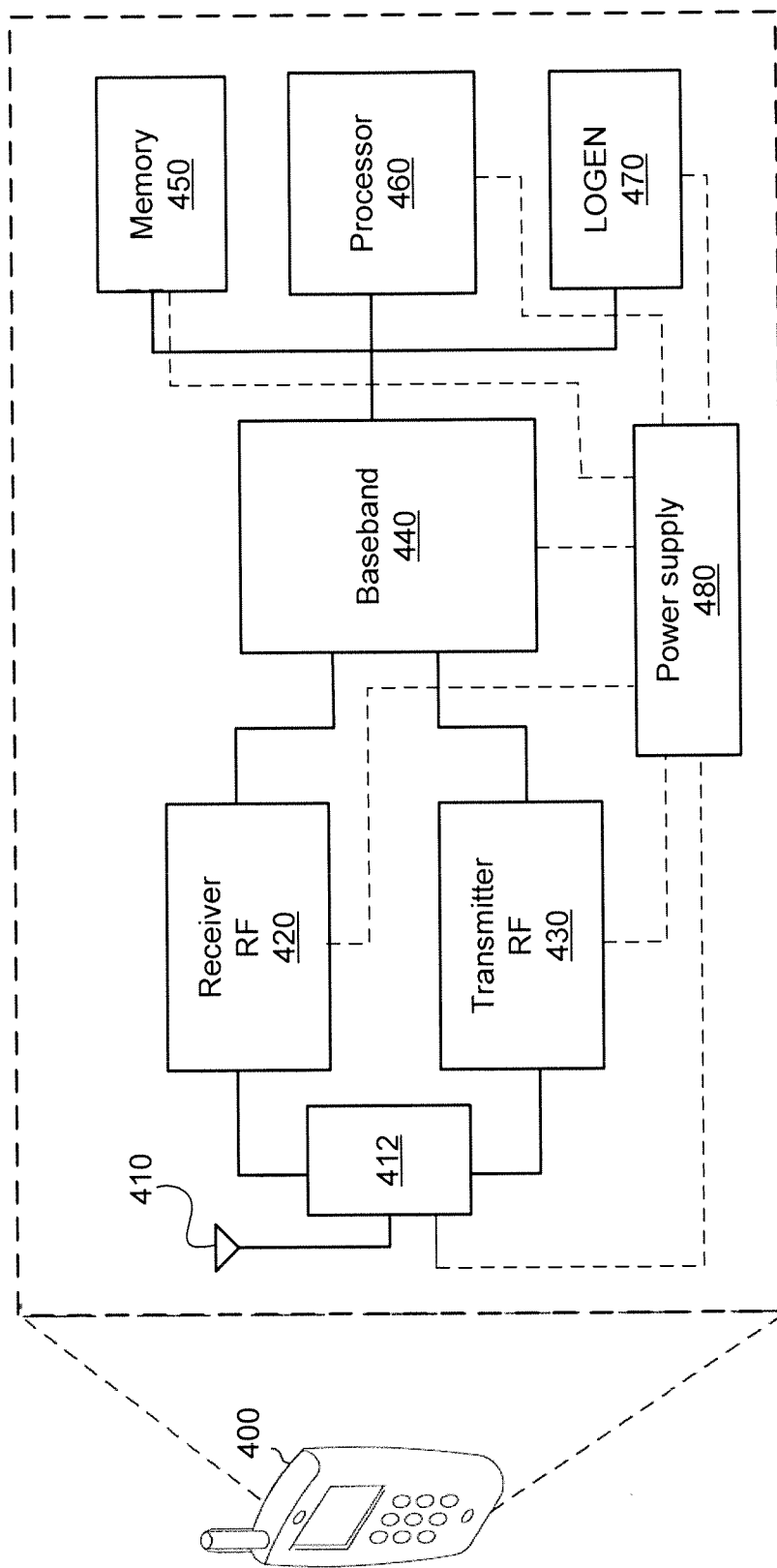
FIG. 4 illustrates an example of a wireless communication device in accordance with one or more implementations.

FIG. 4 illustrates an example of a wireless communication device 400 in accordance with one or more implementations of the subject technology. The wireless communication device 400 includes a radio-frequency (RF) antenna 410, a receiver 420, a transmitter 430, a baseband processing module 440, a memory 450, a processor 460, a local oscillator generator (LOGEN) 470, and a power supply 480. In various embodiments of the subject technology, one or more of the blocks represented in FIG. 4 can be integrated on one or more semiconductor substrates. For example, the blocks 420-470 can be realized in a single chip or a single system on chip, or can be realized in a multi-chip chipset.

The RF antenna 410 can be suitable for transmitting and/or receiving RF signals (e.g., wireless signals) over a wide range of frequencies. Although a single RF antenna 410 is illustrated, the subject technology is not so limited.

The receiver 420 comprises suitable logic circuitry and/or code that can be operable to receive and process signals from the RF antenna 410. The receiver 420 may, for example, be operable to amplify and/or down-convert received wireless signals. In various embodiments of the subject technology, the receiver 420 is operable to cancel noise in received signals and can be linear over a wide range of frequencies. In this manner, the receiver 420 is suitable for receiving signals in accordance with a variety of wireless standards. Wi-Fi, WiMAX, Bluetooth, and various cellular standards.

The transmitter 430 comprises suitable logic circuitry and/or code that can be operable to process and transmit signals from the RF antenna 410. The transmitter 430 may, for example, be operable to up-convert baseband signals to RF signals and amplify RF signals. In various embodiments of the subject technology, the transmitter 430 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 430 is operable to provide signals for further amplification by one or more power amplifiers.

The duplexer 412 provides isolation in the transmit band to avoid saturation of the receiver 420 or damaging parts of the receiver 420, and to relax one or more design requirements of the receiver 420. Furthermore, the duplexer 412 can attenuate the noise in the receive band. The duplexer is operable in multiple frequency bands of various wireless standards.

The baseband processing module 440 comprises suitable logic, circuitry, interfaces, and/or code that can be operable to perform processing of baseband signals. The baseband processing module 440 may, for example, analyze received signals and generate control and/or feedback signals for configuring various components of the wireless communication device 400 such as the receiver 420. The baseband processing module 440 is operable to encode, decode, transcode, modulate, demodulate, encrypt, decrypt, scramble, descramble, and/or otherwise process data in accordance with one or more wireless standards.

The processor 460 comprises suitable logic, circuitry, and/ or code that can enable processing data and/or controlling operations of the wireless communication device 400. In this regard, the processor 460 is enabled to provide control signals to various other portions of the wireless communication device 400. The processor 460 can also control transfers of data between various portions of the wireless communication device 400. Additionally, the processor 460 can enable implementation of an operating system or otherwise execute code to manage operations of the wireless communication device 400.

The memory 450 comprises suitable logic, circuitry, and/or code that can enable storage of various types of information such as received data, generated data, code, and/or configuration information. The local oscillator generator (LOG EN) 470 comprises suitable logic, circuitry, interfaces, and/or code that can be operable to generate one or more oscillating signals of one or more frequencies. The LOGEN 470 can be operable to generate digital and/or analog signals. In this manner, the LOGEN 470 can be operable to generate one or more clock signals and/or sinusoidal signals. Characteristics of the oscillating signals such as the frequency and duty cycle can be determined based on one or more control signals from, for example, the processor 460 and/or the baseband processing module 440.

In operation, the processor 460 can configure the various components of the wireless communication device 400 based on a wireless standard according to which it is desired to receive signals. Wireless signals can be received via the RF antenna 410 and amplified and down-converted by the receiver 420. The baseband processing module 440 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 450, and/or information affecting and/or enabling operation of the wireless communication device 400. The baseband processing module 440 can modulate, encode and perform other processing on audio, video, and/or control signals to be transmitted by the transmitter 430 in accordance to various wireless standards.

Various blocks of the communication device 400, for example, the processor 460, the memory 450, and the baseband 440 may include digital circuitry that can be implemented in a CMOS process that uses dielectric-isolated bulk finFET devices of the subject technology (e.g., 110 of FIG. 1). The receiver 420, the transmitter 430, and LOGEN 470, for instance, can include vertical BJTs, LDMOS devices, ESD diodes, varactor devices, and/or other devices that can be implemented in a COMS process that uses bulk finFET devices. Therefore, the subject technology allows integration of all these blocks by enabling concurrent production of both bulk finFET and dielectric-isolated bulk finFET devices on the same chip.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A fin field-effect transistor (finFET) circuit, the finFET circuit comprising:
   a plurality of bulk finFET devices; and
   a plurality of dielectric-isolated bulk finFET devices, each dielectric-isolated bulk finFET device including a fin that is isolated from a substrate by an oxide layer formed under an active portion of the fin,
   wherein:
   a second structure that includes the plurality of dielectric-isolated bulk finFET devices and the plurality of bulk finFET devices is formed by:
   forming a second isolation layer over a first structure including a plurality of partially exposed fins and horizontal areas including a first isolation layer;
   removing the second isolation layer from horizontal areas over the first isolation layer of the first portion of the first structure;
   forming the oxide layer under active portions of the plurality of partially exposed fins of the first portion of the first structure; and
   removing the second isolation layer in order to expose the plurality of partially exposed fins and horizontal areas of first structure to form the second structure.

2. The finFET circuit of claim 1, wherein forming the second isolation layer comprises forming a silicon nitride layer, and wherein forming the second isolation layer is performed by atomic-layer deposition (ALD) or molecular-layer deposition (MLD).

3. The finFET circuit of claim 1, wherein the first structure comprises a plurality of fins formed on the substrate, wherein the plurality of fins are partially exposed above the first isolation layer, and wherein exposed portions of the plurality of fins are the active portions of the plurality of fins.

4. The finFET circuit of claim 3, wherein the substrate comprises silicon, and wherein the first isolation layer comprises a shallow-trench isolation (STI) layer.

5. The finFET circuit of claim 1, wherein the first portion of the first structure comprises a fin-on-oxide region, wherein the second isolation layer is removed from horizontal areas of the first portion of the first structure by forming a mask over a remaining portion of first structure using a spacer-etch process, and wherein the remaining portion of first structure comprises a bulk-fin region.

6. The finFET circuit of claim 1, wherein the oxide layer under the fins of the first portion of the first structure is formed by an oxidation process, for which the first isolation layer is not a barrier.

7. The finFET circuit of claim 1, further comprising gate regions formed over the plurality of partially exposed fins of the second structure.

8. The finFET circuit of claim 7, wherein the gate regions comprise a gate oxide layer, a high-K dielectric layer, and a work-function metal and gate metal layer that is formed over the plurality of partially exposed fins of the second structure.

9. A communication device, comprising:
   a fin field-effect transistor (finFET) integrated circuit that comprises a plurality of bulk finFET devices and a plurality of dielectric-isolated bulk finFET devices,
   wherein:
   each dielectric-isolated bulk finFET device includes a fin that is isolated from a substrate by an oxide layer formed under an active portion of the fin, and
   a second structure that includes the plurality of dielectric-isolated bulk finFET devices and the plurality of bulk finFET devices is formed by:
   forming a second isolation layer over a first structure including a plurality of partially exposed fins and horizontal areas including a first isolation layer;
   removing the second isolation layer from horizontal areas over the first isolation layer of the first portion of the first structure;
   forming the oxide layer under active portions of the plurality of partially exposed fins of the first portion of the first structure; and
   removing the second isolation layer in order to expose the plurality of partially exposed fins and horizontal areas of first structure to form the second structure.

10. The communication device of claim 9, wherein forming the second isolation layer comprises forming a silicon nitride layer, and wherein forming the second isolation layer is performed by atomic-layer deposition (ALD) or molecular-layer deposition (MLD).

11. The communication device of claim 9, wherein the first structure comprises a plurality of fins formed on the substrate, wherein the plurality of fins are partially exposed above the first isolation layer, and wherein exposed portions of the plurality of fins are the active portions of the plurality of fins.

12. The communication device of claim 9, wherein the substrate comprises silicon, and wherein the first isolation layer comprises a shallow-trench isolation (STI) layer, and where the plurality of bulk finFET devices and the plurality of dielectric-isolated bulk finFET devices comprise gate regions formed over the plurality of partially exposed fins of the second structure.

* * * * *